United States Patent
Zhang et al.

(10) Patent No.: US 11,341,877 B2
(45) Date of Patent: May 24, 2022

(54) COMPENSATION DEVICE, DISPLAY SCREEN, DISPLAY DEVICE AND COMPENSATION METHOD

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Na Zhang, Beijing (CN); Bin Zhang, Beijing (CN); Jing Wang, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 91 days.

(21) Appl. No.: 16/756,929

(22) PCT Filed: Aug. 27, 2019

(86) PCT No.: PCT/CN2019/102829
§ 371 (c)(1),
(2) Date: Apr. 17, 2020

(87) PCT Pub. No.: WO2020/114015
PCT Pub. Date: Jun. 11, 2020

(65) Prior Publication Data
US 2021/0158732 A1    May 27, 2021

(30) Foreign Application Priority Data
Dec. 6, 2018   (CN) .......................... 201811485852.9

(51) Int. Cl.
*G09G 3/3233*  (2016.01)
*G09G 3/00*    (2006.01)
*H01L 41/08*   (2006.01)

(52) U.S. Cl.
CPC .......... *G09G 3/006* (2013.01); *G09G 3/3233* (2013.01); *H01L 41/0805* (2013.01);
(Continued)

(58) Field of Classification Search
CPC ................ G09G 3/006; G09G 3/3233; G09G 2320/045; G09G 2330/028;
(Continued)

(56) References Cited

U.S. PATENT DOCUMENTS

2013/0082970 A1* 4/2013 Frey .................... G06F 3/04144
345/173
2014/0300529 A1   10/2014 Kim et al.
(Continued)

FOREIGN PATENT DOCUMENTS

CN   102930824 A   2/2013
CN   103792478 A   5/2014
(Continued)

*Primary Examiner* — Jeff Piziali
(74) *Attorney, Agent, or Firm* — The Webb Law Firm

(57) ABSTRACT

The present disclosure provides a compensation device, a display screen, a display device, and a compensation method. The compensation device includes a detection circuit and a processor. The detection circuit includes a resistance-sensitive element provided in a deformation area of the display screen. A resistance of the resistance-sensitive element changes when the resistance-sensitive element is deformed. The detection circuit is configured to detect a resistance change amount of the resistance-sensitive element. The processor is configured to obtain a drift amount of a characteristic curve of a driving transistor in the deformation area according to the resistance change amount, and adjust a driving voltage signal output to the driving transistor according to the drift amount.

17 Claims, 5 Drawing Sheets

(52) U.S. Cl.
CPC . *G09G 2320/045* (2013.01); *G09G 2330/028* (2013.01); *G09G 2380/02* (2013.01)

(58) Field of Classification Search
CPC ....... G09G 2380/02; G09G 2320/0233; G09G 3/3208; H01L 41/0805
See application file for complete search history.

(56) References Cited

U.S. PATENT DOCUMENTS

| | | | |
|---|---|---|---|
| 2014/0306985 A1 | 10/2014 | Jeong et al. | |
| 2014/0331781 A1* | 11/2014 | Lee | G06F 1/1626 |
| | | | 73/849 |
| 2015/0192481 A1 | 7/2015 | Nguyen et al. | |
| 2015/0296607 A1* | 10/2015 | Yang | G01L 1/205 |
| | | | 361/750 |
| 2015/0301636 A1 | 10/2015 | Akimoto et al. | |
| 2017/0025059 A1* | 1/2017 | Lu | G09G 3/2007 |
| 2017/0345351 A1 | 11/2017 | Kwon et al. | |
| 2018/0005571 A1 | 1/2018 | Song | |
| 2018/0033398 A1* | 2/2018 | Okamoto | G09G 3/3233 |
| 2018/0040678 A1 | 2/2018 | Zhai | |
| 2019/0057649 A1* | 2/2019 | Takizawa | G09G 3/3266 |
| 2019/0073946 A1 | 3/2019 | Su | |
| 2019/0214544 A1* | 7/2019 | Mori | G06F 3/0414 |
| 2019/0393278 A1* | 12/2019 | Wu | G06F 3/04144 |
| | | | 345/173 |

FOREIGN PATENT DOCUMENTS

| | | | | |
|---|---|---|---|---|
| CN | 104112399 A | 10/2014 | | |
| CN | 104583908 A | 4/2015 | | |
| CN | 104900186 A | 9/2015 | | |
| CN | 104952386 A | 9/2015 | | |
| CN | 105551427 A | 5/2016 | | |
| CN | 106910842 A | 6/2017 | | |
| CN | 107195667 A | 9/2017 | | |
| CN | 107331304 A | 11/2017 | | |
| CN | 107437400 A | 12/2017 | | |
| CN | 108352149 A | 7/2018 | | |
| CN | 110164340 A | 8/2019 | | |
| KR | 1020180047590 A | 5/2018 | | |
| WO | WO-2017094604 A1 * | 6/2017 | ........... G09G 3/3266 |
| WO | WO-2018056165 A1 * | 3/2018 | ............... G01L 1/16 |
| WO | 2018205565 A1 | 11/2018 | | |

* cited by examiner

COMPENSATION DEVICE, DISPLAY SCREEN, DISPLAY DEVICE AND COMPENSATION METHOD

CROSS-REFERENCE TO RELATED APPLICATIONS

This application is the United States national phase of International Application No. PCT/CN2019/102829 filed Aug. 27, 2019, and claims priority to China Patent Application No. 201811485852.9 filed Dec. 6, 2018, the disclosures of which are hereby incorporated by reference in their entirety.

TECHNICAL FIELD

The present disclosure relates to a compensation device, a display screen, a display device, and a compensation method.

BACKGROUND

At present, a folding display screen, such as a folding flexible OLED (Organic Light Emitting Diode) display screen, may be manufactured by a flexible display technology based on LTPS (Low Temperature Poly-silicon) technology. For example, a TFT (Thin Film Transistor) may be on a PI (Polyimide) substrate by using the LTPS technology so as to form a flexible display substrate.

SUMMARY

According to an aspect of embodiments of the present disclosure, a compensation device for a display screen is provided. The compensation device comprises: a detection circuit comprising a resistance-sensitive element provided in a deformation area of the display screen and configured to detect a resistance change amount of the resistance-sensitive element, wherein a resistance of the resistance-sensitive element changes when the resistance-sensitive element is deformed; and a processor configured to obtain a drift amount of a characteristic curve of a driving transistor in the deformation area according to the resistance change amount, and adjust a driving voltage signal output to the driving transistor according to the drift amount.

In some embodiments, the detection circuit comprises: a Huygens bridge circuit comprising the resistance-sensitive element and configured to generate a bridge current in a case where the resistance-sensitive element is deformed; a current-voltage conversion circuit configured to convert the bridge current into an analog voltage amount; and an analog-to-digital conversion circuit configured to convert the analog voltage amount into a digital amount and transmit the digital amount to the processor, wherein the digital amount represents the resistance change amount.

In some embodiments, the Huygens bridge circuit further comprises: a first resistor, a first terminal of the first resistor being electrically connected to one terminal of a power supply, one terminal of the resistance-sensitive element being electrically connected to another terminal of the power supply, and a second terminal of the first resistor being electrically connected to another terminal of the resistance-sensitive element and an input terminal of the current-voltage conversion circuit; a second resistor, a first terminal of the second resistor being electrically connected to the one terminal of the power supply, and a second terminal of the second resistor being electrically connected to the another terminal of the resistance-sensitive element; and a third resistor, a first terminal of the third resistor being electrically connected to the another terminal of the power supply, and a second terminal of the third resistor being electrically connected to the another terminal of the resistance-sensitive element.

In some embodiments, the processor is configured to obtain a bending degree of the deformation area according to the resistance change amount, and obtain the drift amount of the characteristic curve of the driving transistor in the deformation area according to the bending degree.

In some embodiments, the processor is configured to adjust a voltage value or a duty cycle of the driving voltage signal output to the driving transistor according to the drift amount.

In some embodiments, the processor is configured to determine whether the drift amount of the characteristic curve is greater than a threshold value, and adjust the voltage value or the duty cycle of the driving voltage signal according to the drift amount in a case where the drift amount is greater than the threshold value.

In some embodiments, the processor is configured to obtain a change in a driving current flowing from the driving transistor according to the drift amount, increase the voltage value or the duty cycle of the driving voltage signal in a case where the driving current decreases, and reduce the voltage value or the duty cycle of the driving voltage signal in a case where the driving current increases.

In some embodiments, the processor is further configured to determine bending times of the deformation area according to times of occurrence of the resistance change amount, and obtain the drift amount of the characteristic curve according to the bending degree and the bending times.

In some embodiments, the resistance-sensitive element comprises a piezoelectric thin film structural layer or a piezoresistive material layer.

In some embodiments, the resistance-sensitive element comprises: a first electrode layer and a second electrode layer; a first optically clear adhesive layer and a second optically clear adhesive layer, wherein the first optically clear adhesive layer and the second optically clear adhesive layer are between the first electrode layer and the second electrode layer; and a piezoelectric thin film layer between the first optically clear adhesive layer and the second optically clear adhesive layers.

According to another aspect of the present disclosure, a display screen is provided. The display screen comprises the compensation device as described above.

In some embodiments, the display screen is a folding display screen, and the deformation area comprises a folding area.

According to another aspect of the present disclosure, a display device is provided. The display device comprises the display screen as described above.

According to another aspect of the present disclosure, a compensation method for a display screen is provided. The method comprises: detecting a resistance change amount of a resistance-sensitive element provided in a deformation area of the display screen, wherein a resistance of the resistance-sensitive element changes when the resistance-sensitive element is deformed; obtaining a drift amount of a characteristic curve of a driving transistor in the deformation area according to the resistance change amount; and adjusting a driving voltage signal output to the driving transistor according to the drift amount.

In some embodiments, the detecting of the resistance change amount of the resistance-sensitive element comprises: generating a bridge current by a Huygens bridge circuit in a case where the resistance-sensitive element is deformed; converting the bridge current into an analog voltage amount; and converting the analog voltage amount into a digital amount, wherein the digital amount represents the resistance change amount.

In some embodiments, the obtaining of the drift amount of the characteristic curve of the driving transistor in the deformation area according to the resistance change amount comprises: obtaining a bending degree of the deformation area according to the resistance change amount; and obtaining the drift amount of the characteristic curve of the driving transistor in the deformation area according to the bending degree.

In some embodiments, the adjusting of the driving voltage signal output to the driving transistor according to the drift amount comprises: adjusting a voltage value or a duty cycle of the driving voltage signal output to the driving transistor according to the drift amount.

In some embodiments, the adjusting of the voltage value or the duty cycle of the driving voltage signal according to the drift amount comprises: determining whether the drift amount of the characteristic curve is greater than a threshold value; and adjusting the voltage value or the duty cycle of the driving voltage signal according to the drift amount in a case where the drift amount is greater than the threshold value.

In some embodiments, the adjusting of the voltage value or the duty cycle of the driving voltage signal according to the drift amount comprises: obtaining a change in a driving current flowing from the driving transistor according to the drift amount; increasing the voltage value or the duty cycle of the driving voltage signal in a case where the driving current decreases; and reducing the voltage value or the duty cycle of the driving voltage signal in a case where the driving current increases.

In some embodiments, the obtaining of the drift amount of the characteristic curve of the driving transistor in the deformation area according to the resistance change amount comprises: obtaining a bending degree of the deformation area according to the resistance change amount; determining bending times of the deformation area according to times of occurrence of the resistance change amount; and obtaining the drift amount of the characteristic curve of the driving transistor in the deformation area according to the bending degree and the bending times.

Other features and advantages of the present disclosure will become apparent from the following detailed description of exemplary embodiments of the present disclosure in conjunction with the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description in conjunction with the accompanying drawings, in which.

Figure 1A:
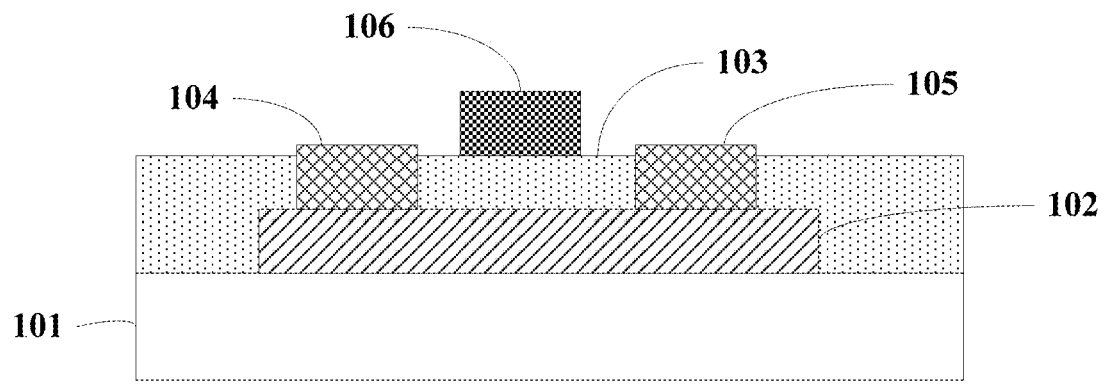
FIG. 1A is a schematic cross-sectional view showing a structure of a thin film transistor according to an embodiment.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail in conjunction with the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include", or the like means that the element before the word covers the element(s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

The inventors of the present disclosure have found that, during the process that certain display screens (e.g., folding display screens) are repeatedly bended or folded, due to the presence of mechanical stress, the characteristics of the TFT of the display screen will drift, thereby causing a change in the brightness of a sub-pixel of the display screen, so that the display screen has uneven light emission in a deformation area (e.g., a folding area) of the display screen.

FIG. 1A is a schematic cross-sectional view showing a structure of a thin film transistor according to an embodiment.

As shown in FIG. 1A, the thin film transistor comprises: a substrate (e.g., a PI substrate) 101, a semiconductor layer 102 on the substrate 101, a source 104 and a drain 105 on the semiconductor layer 102, a gate insulating layer 103 between the source 104 and the drain 105, and a gate 106 on the gate insulating layer 103. A structure of the thin film transistor is a top-gate TFT structure.

Figure 1B:
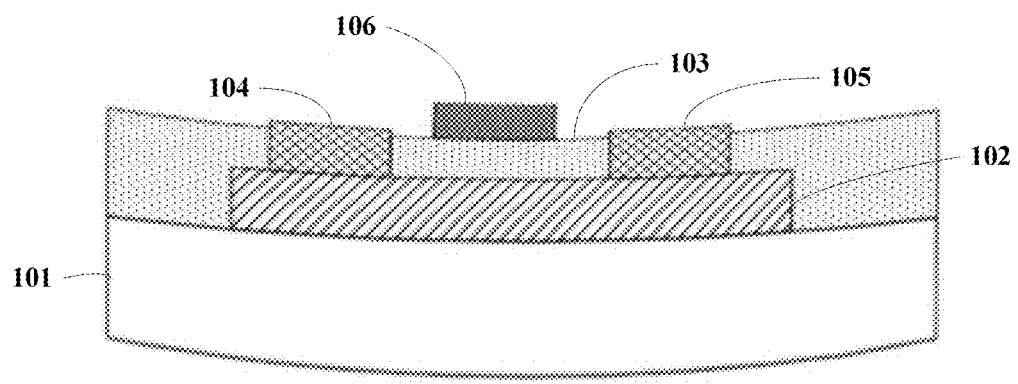
FIG. 1B is a schematic cross-sectional view showing a thin film transistor under a compressive stress according to an embodiment.
Figure 1C:
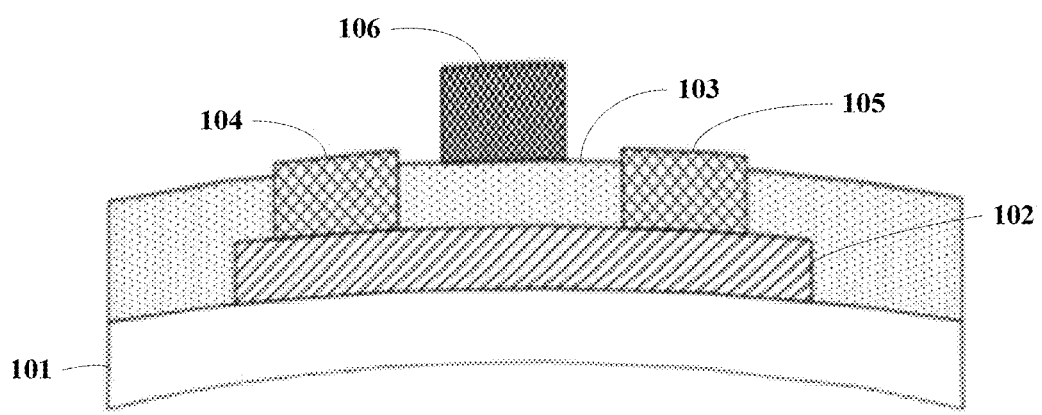
FIG. 1C is a schematic cross-sectional view showing a thin film transistor under a tensile stress according to an embodiment.

FIG. 1B is a schematic cross-sectional view showing a thin film transistor under a compressive stress according to an embodiment. FIG. 1C is a schematic cross-sectional view showing a thin film transistor under a tensile stress according to an embodiment. In an actual folding product (e.g., a folding display screen), the thin film transistor may produce different stress states due to different bending directions. For example, as shown in FIG. 1B, the thin film transistor bends toward the side of the gate under the action of compressive stress. For another example, as shown in FIG. 1C, The thin film transistor bends toward the side of the substrate under the action of tensile stress.

The inventors of the present disclosure have found that, when the thin film transistor is subjected to multiple different bending stresses, TFT characteristics of the thin film transistor (e.g., the current-voltage characteristics (IV characteristics) of the thin film transistor) change differently. When the thin film transistor is subjected to compressive stress, the threshold voltage $V_{th}$ of the thin film transistor will increase and the mobility of the thin film transistor will decrease, thereby causing a current (such as a source-drain current $I_{DS}$) of the thin film transistor to decrease. When the thin-film transistor is subjected to tensile stress, the threshold voltage $V_{th}$ of the thin-film transistor will decrease, and the mobility of the thin-film transistor will increase, thereby causing the current of the thin-film transistor to increase. Therefore, the TFT characteristic of the thin film transistor may drift when the thin film transistor is subjected to different bending stresses. The drift of the TFT characteristic of the thin-film transistor is a process of gradually drifting as bending times increase.

In an OLED display panel of the display screen, the thin film transistor may be applied as a driving transistor in a TFT pixel circuit. There are a plurality of solutions for designing the TFT pixel circuit. A basic calculation formula is shown as follows:

$$I_{DS} = \frac{1}{2}\mu C_{OX}\frac{W}{L}(V_{gs} - V_{th})^2, \quad (1)$$

where $I_{DS}$ is a driving current (i.e., the source-drain current) output by the driving transistor to drive an OLED to emit light, p is an effective carrier mobility, $C_{ox}$ is a capacitance of the driving transistor, W/L is a aspect ratio of the driving transistor, $V_{gs}$ is a gate-source voltage of the driving transistor, and $V_{th}$ is a threshold voltage of the driving transistor. It may be seen from the above-described formula (1) that, the driving current $I_{DS}$ is affected by the effective carrier mobility p and the threshold voltage $V_{th}$.

The folding display screen has a deformation area. For example, the deformation area is a folding area. When the driving transistor in the folding area is folded or bended, a threshold voltage and effective carrier mobility of the driving transistor will change, which affects the driving current output by the driving transistor. This may cause light emission brightness of different OLEDs to be different, so that the problem of uneven light emission may occur in the deformation area of the display screen when the display screen is displayed.

In view of this, embodiments of the present disclosure provide a compensation device for a display screen to compensate for light emission brightness of the deformation area, so that the light emission brightness of the deformation area is more uniform. The compensation device according to some embodiments of the present disclosure will be described in detail below in conjunction with the accompanying drawings.

Figure 2:
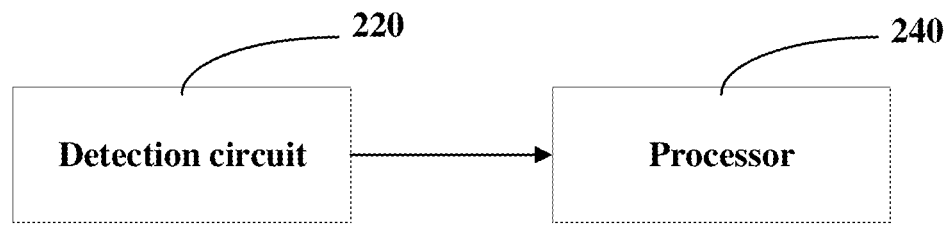
FIG. 2 is a connection view showing a compensation device for a display screen according to an embodiment of the present disclosure.

FIG. 2 is a connection view showing a compensation device for a display screen according to an embodiment of the present disclosure. For example, the compensation device may be used in a folding display screen. As shown in FIG. 2, the compensation device comprises a detection circuit 220 and a processor 240.

The detection circuit 220 comprises a resistance-sensitive element (not shown in FIG. 1A) provided in a deformation area (e.g., a folding area) of the display screen. A resistance of the resistance-sensitive element changes when the resistance-sensitive element is deformed (for example, bended). The detection circuit 220 is configured to detect a resistance change amount of the resistance-sensitive element. The detection circuit 220 transmits the resistance change amount to the processor 240.

The processor 240 is configured to obtain a drift amount of a characteristic curve (e.g., an IV characteristic curve) of a driving transistor in the deformation area according to the resistance change amount, and adjust a driving voltage signal output to the driving transistor according to the drift amount.

In the embodiment, a compensation device according to some embodiments of the present disclosure is provided. In the compensation device, the detection circuit detects the resistance change amount of the resistance-sensitive element in the deformation area and transmits the resistance change amount to the processor. The processor obtains the drift amount of the characteristic curve of the driving transistor in the deformation area according to the resistance change amount, and adjusts the driving voltage signal output to the driving transistor according to the drift amount. By adjusting the driving voltage signal, the brightness compensation of the deformation area may be achieved, so that the light emission brightness of the deformation area is more uniform.

In some embodiments, the processor 240 may be configured to obtain a bending degree of the deformation area according to the resistance change amount, and obtain the drift amount of the characteristic curve of the driving transistor in the deformation area according to the bending degree. Here, the bending degree of the deformation area may also represent a bending degree of the driving transistor in the deformation area.

For example, the processor may store a correspondence table between the bending degree and the drift amount in advance. After obtaining the bending degree of the deformation area, the processor retrieves the correspondence table to obtain a corresponding drift amount.

In some embodiments, the processor 240 may be configured to adjust a voltage value or a duty cycle of the driving voltage signal output to the driving transistor according to the drift amount.

A gate-source voltage of the driving transistor may be adjusted by adjusting the voltage value of the driving voltage signal, thereby adjusting the light emission brightness of the pixels in the deformation area. In this way, the brightness compensation in the deformation area may be achieved, so that the light emission brightness of the deformation area is more uniform.

Light emission time of the pixels in the deformation area may be adjusted by adjusting the duty cycle of the driving voltage signal. Since the perception of the brightness by human eye is an integral of the brightness within a period of time, in the case of a constant brightness, the longer the light emission time is, the brighter the brightness perceived by human eye will be. Therefore, the adjustment of the light emission time of the pixels is also equivalent to the adjustment of the light emission brightness of the pixels, thereby realizing the brightness compensation of the deformation area. In addition, when the duty cycle of the driving voltage signal is adjusted, a high frequency of the driving voltage signal may be made higher (e.g., above 200 Hz), so that a flicker phenomenon perceived by human eye may be prevented.

In some embodiments, the processor 240 may be configured to determine whether the drift amount of the characteristic curve of the driving transistor is greater than a threshold value (which may be referred to as a threshold value of the drift amount), and adjust the voltage value or the duty cycle of the driving voltage signal according to the drift amount in a case where the drift amount is greater than the threshold value. In some embodiments, the threshold value may range from 0.001V to 0.01V. For example, the threshold value may be 0.003V. Of course, those skilled in the art may understand that the threshold value may be determined according to actual needs.

For example, in some cases, the bending degree of the deformation region is not large, so that the drift amount of the characteristic curve of the driving transistor is not large. For example, the drift amount does not exceed the threshold value. In such case, since the drift of the light emission brightness is not large, the voltage value and the duty cycle of the driving voltage signal may not be adjusted. However, when the bending degree of the deformation area increases, which causes the drift amount of the characteristic curve of the driving transistor to be greater than the threshold value, the brightness compensation may be achieved by adjusting the voltage value or the duty ratio of the driving voltage signal.

In some embodiments, the processor 240 may be configured to obtain a change (e.g., increase or decrease) in a driving current flowing from the driving transistor according to the drift amount of the characteristic curve of the driving transistor. For example, the processor may store a correspondence between the drift amount of the characteristic curve and the change in the driving current in advance. For example, different drift amounts may correspond to different increases or decreases in the driving current. In this way, the processor 240 may obtain the change in the driving current according to the drift amount of the characteristic curve of the driving transistor. The processor 240 is also configured to increase the voltage value or the duty cycle of the driving voltage signal in a case where the driving current decreases, and reduce the voltage value or the duty cycle of the driving voltage signal in a case where the driving current increases.

In the embodiment, the processor may obtain the change in the driving current to drive the light emitting device (e.g., an OLED) to emit light according to the drift amount of the characteristic curve. By increasing the voltage value or the duty cycle of the driving voltage signal in a case where the driving current decreases, it is possible to increase the light emission brightness of the light emitting device in a case where the light emission brightness of the light emitting device in the deformation area decreases. By reducing the voltage value or the duty cycle of the driving voltage signal in a case where the driving current increases, it is possible to reduce the light emission brightness of the light emitting device in a case where the light emission brightness of the light emitting device in the deformation area increases. In this way, a uniform light emission in the entire deformation area can be achieved.

In some embodiments, the processor 240 may be further configured to determine bending times of the deformation area according to times of occurrence of the resistance change amount, and obtain the drift amount of the characteristic curve according to the bending degree and the bending times of the deformation area.

For example, in addition to the bending degree of the deformation area, the drift amount of the characteristic curve of the driving transistor may also be related to the bending times of the deformation area. The drift of the characteristic curve is a gradual drifting process as the bending times increase. Therefore, in this embodiment, the processor may record the bending times of the deformation area according to the times of occurrence of the resistance change amount (i.e., the times of changes in the resistance). For example, when the resistance of the resistance-sensitive element changes once, and the processor records the deformation area (or the driving transistor in the deformation area) is bended once. The processor may store a correspondence table among the bending degree, the bending times, and the drift amount of the characteristic curve in advance. The processor obtains the drift amount of the characteristic curve by retrieving the correspondence table after obtaining the bending degree and the bending times of the deformation area.

Figure 3A:
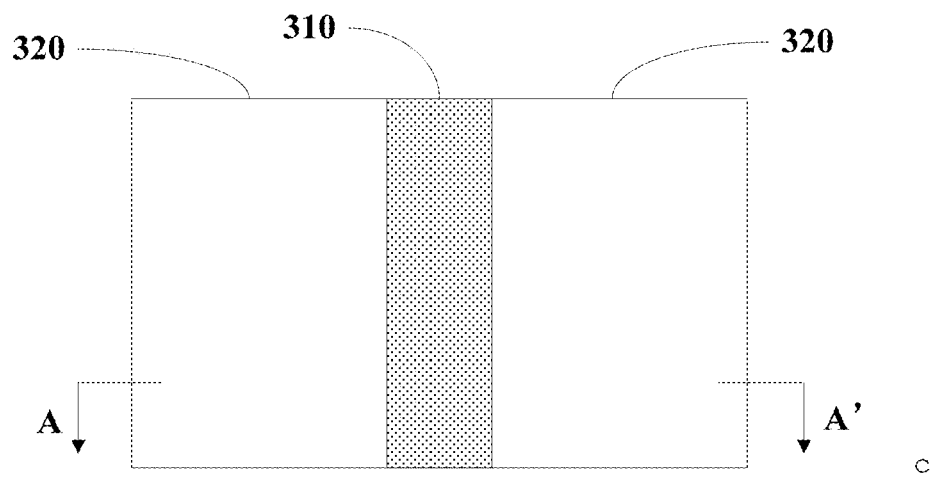
FIG. 3A is a top view showing a folding display screen according to an embodiment of the present disclosure.

FIG. 3A is a top view showing a folding display screen according to an embodiment of the present disclosure. As shown in FIG. 3A, the folding display screen comprises a deformation area (e.g., a folding area) 310 and rigid areas 320 on both sides of the deformation area 310. The aforementioned resistance-sensitive element is in a structural layer of the deformation area.

Figure 3B:
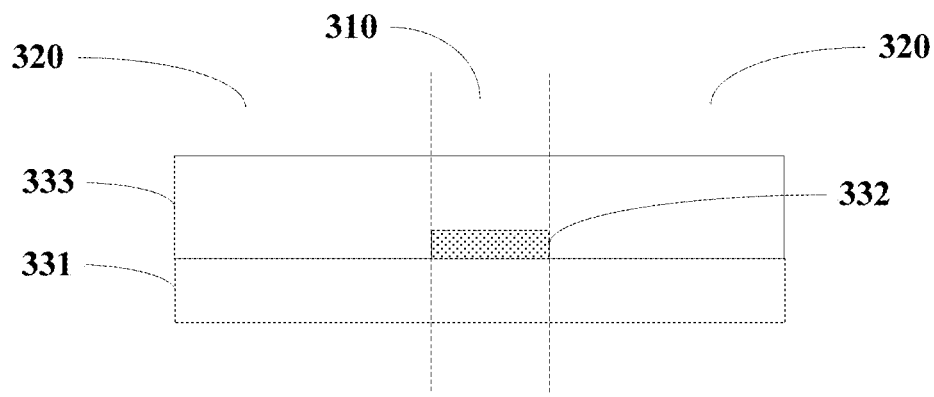
FIG. 3B is a schematic cross-sectional view showing a structure of a folding display screen taken along a line A-A' in FIG. 3A according to an embodiment of the present disclosure.

FIG. 3B is a schematic cross-sectional view showing a structure of a folding display screen taken along a line A-A' in FIG. 3A according to an embodiment of the present disclosure. As shown in FIG. 3B, the folding display comprises a display panel 331, a resistance-sensitive element 332 on the display panel 331, and another structural layer 333 covering the resistance-sensitive element 332. For example, another structural layer 333 comprises a touch layer, or the like. As shown in FIG. 3B, the resistance-sensitive element 332 is located at the deformation area 310. When the deformation area is bended or folded, the resistance-sensitive element is bended. The resistance-sensitive element 332 when bended is subjected to a change in a compressive stress or a tensile stress, which may result in a change in the resistance of the resistance-sensitive element.

Figure 4:
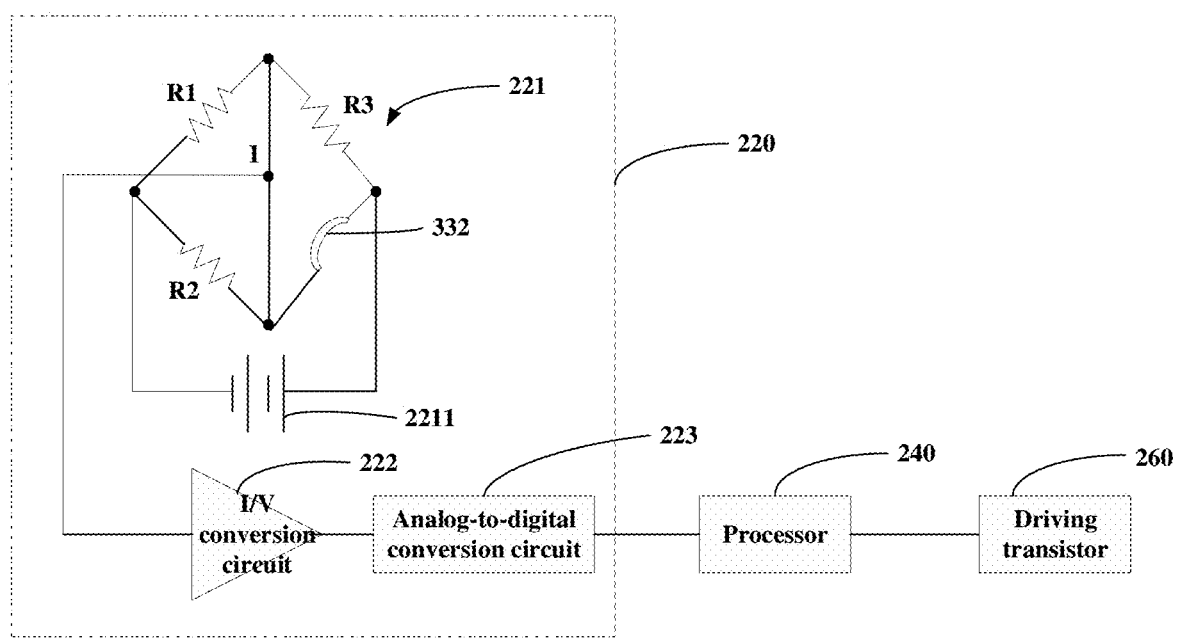
FIG. 4 is a connection view showing a compensation device for a display screen according to another embodiment of the present disclosure.

FIG. 4 is a connection view showing a compensation device for a display screen according to another embodiment of the present disclosure. The compensation device comprises the detection circuit 220 and the processor 240. In addition, FIG. 4 also shows a driving transistor 260.

In some embodiments, as shown in FIG. 4, the detection circuit 220 may comprise a Huygens bridge circuit 221, a current-voltage conversion circuit (referred to as an I/V conversion circuit) 222, and an analog-to-digital conversion circuit 223.

The Huygens bridge circuit 221 comprises the resistance-sensitive element 332. The Huygens bridge circuit 221 is configured to generate a bridge current I in a case where the resistance-sensitive element 332 is deformed. Moreover, the Huygens bridge circuit 221 transmits the bridge current I to the current-voltage conversion circuit 222.

In some embodiments, as shown in FIG. 4, the Huygens bridge circuit 221 may further comprise a first resistor R1, a second resistor R2, and a third resistor R3. A first terminal of the first resistor R1 and a first terminal of the second resistor R2 are electrically connected to one terminal (e.g., a negative terminal) of a power supply 2211. A first terminal of the third resistor R3 and one terminal of the resistance-sensitive element 332 are electrically connected to another terminal (e.g., a positive terminal) of the power supply 2211. A second terminal of the first resistor R1, a second terminal of the second resistor R2 and a second terminal of the third resistor R3 are electrically connected to another terminal of the resistance-sensitive element 332, and electrically connected to an input terminal of the current-voltage conversion circuit 222. Here, the resistances of the first resistor R1, the second resistor R2, and the third resistor R3 are all known resistances.

In the embodiment, the resistance of the resistance-sensitive element changes when the resistance-sensitive element is bended, so that the balance of the Huygens bridge circuit is broken, thereby generating a current I. The current I is transmitted to the input terminal of the current-voltage conversion circuit 222.

It should be noted that the above-described power supply 2211 may be provided outside the Huygens bridge circuit as an external power supply, or inside the Huygens bridge circuit as an internal power supply.

The current-voltage conversion circuit 222 is configured to convert the bridge current I into an analog voltage amount. Moreover, the current-voltage conversion circuit 222 transmits the analog voltage amount to the analog-to-digital conversion circuit 223.

The analog-to-digital conversion circuit 223 is configured to convert the analog voltage amount into a digital amount and transmit the digital amount to the processor 240. The digital amount represents the resistance change amount of the resistance-sensitive element 332.

In the above-described embodiment, the collection of the resistance change amount of the resistance-sensitive element is achieved. By transmitting the resistance change amount to the processor 240, the processor 240 adjusts the voltage value or the duty cycle of the driving voltage signal output to the driving transistor 260 according to the resistance change amount. In this way, the brightness compensation of the deformation area is achieved, so that the light emission brightness of the deformation area is more uniform.

Figure 5:
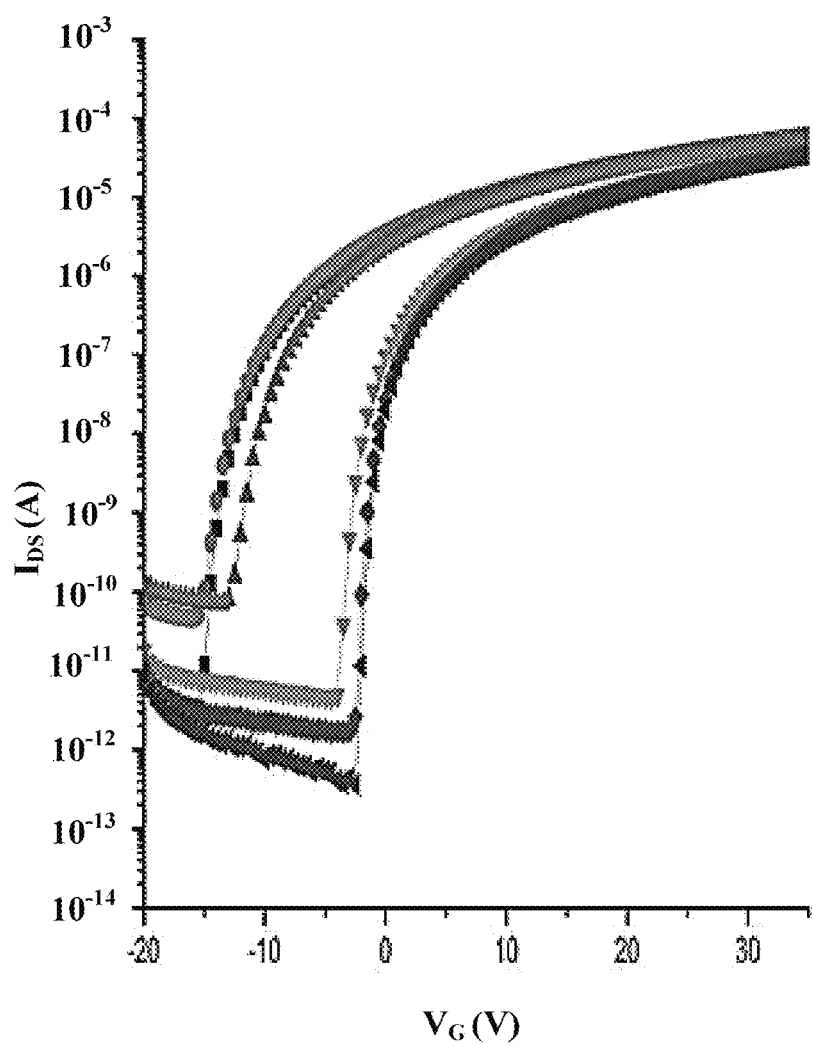
FIG. 5 is a schematic view showing characteristic curves of driving transistors according to an embodiment of the present disclosure.

FIG. 5 is a schematic view showing characteristic curves of driving transistors according to an embodiment of the present disclosure. FIG. 5 shows several characteristic curves. Each characteristic curve corresponds to one driving transistor. An abscissa of the characteristic curve is a gate voltage (i.e., a driving voltage signal) $V_G$ of the driving transistor, and an ordinate of the characteristic curve is a source-drain current (i.e., the driving current to drive the light emitting device (e.g., OLED) to emit light) $I_{DS}$ of the driving transistor. Taking any one of the characteristic curves as an example, after the deformation area is bended or folded for several times, the characteristic curve may drift left or right. The processor adjusts the voltage value or the duty cycle of the driving voltage signal so that the drift characteristic curve returns to an original position, thereby achieving the brightness compensation.

In some embodiments, the resistance-sensitive element comprises a piezoelectric thin film structural layer. A structure of the piezoelectric thin film structural layer may be shown by referring to FIG. 6.

Figure 6:
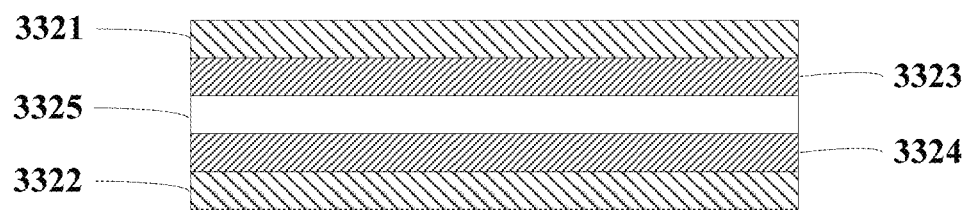
FIG. 6 is a schematic cross-sectional view showing a structure of a resistance-sensitive element according to an embodiment of the present disclosure.

FIG. 6 is a schematic cross-sectional view showing a structure of a resistance-sensitive element according to an embodiment of the present disclosure. As shown in FIG. 6, the resistance-sensitive element 332 comprises a first electrode layer 3321, a second electrode layer 3322, a first OCA (Optically Clear Adhesive) layer 3323, a second OCA layer 3324, and a piezoelectric thin film layer 3325. The first OCA layer 3323 and the second OCA layer 3324 are between the first electrode layer 3321 and the second electrode layer 3322. The piezoelectric thin film layer 3325 is between the first OCA layer 3323 and the second OCA layer 3324. For example, materials of the first electrode layer 3321 and the second electrode layer 3322 may be ITO (Indium Tin Oxide). For example, the first electrode layer 3321 may serve as the one terminal of the resistance-sensitive element, and the second electrode layer 3322 may serve as the another terminal of the resistance-sensitive element.

In the embodiment, the resistance-sensitive element adopts the form of the piezoelectric thin film structural layer. A resistance of the piezoelectric thin film structural layer changes when the piezoelectric thin film structural layer is bended. For example, the greater the bending degree of the piezoelectric thin film structural layer is, the greater stress the piezoelectric thin film structural layer will be subjected to, and the more obvious the corresponding piezoelectric effect will be. In this case, the resistance of the piezoelectric thin film structural layer also changes accordingly. In addition, the proportional relationship between the resistance change amount and the bending degree may be determined by the bending degree-resistance change curve that is actually measured.

In other embodiments, the resistance-sensitive element may comprise a piezoresistive material layer. For example, a material of the piezoresistive material layer is a composite material having piezoresistive properties, which mainly comprises a resin and metalized fibers dispersed in the resin.

A resistance of the piezoresistive material layer changes when the piezoresistive material layer is bended.

In some embodiments of the present disclosure, a display screen is also provided. The display screen may comprise the compensation device as described above (e.g., the compensation device shown in FIG. 2 or 4). For example, the display screen is a folding display screen, and the above-described deformation area comprises a folding area.

In some embodiments of the present disclosure, a display device is also provided. The display device may comprise the display screen as described above (e.g. the folding display screen). For example, the display device may be any product or component having a display function such as a display, a mobile phone, a tablet computer, a notebook computer, a television, or a navigator.

Figure 7:
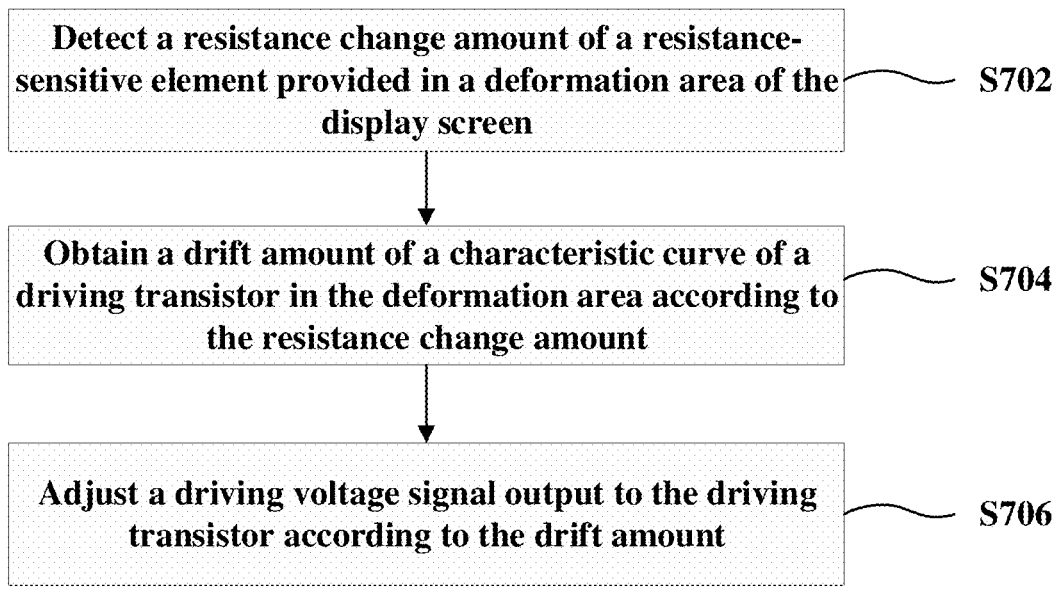
FIG. 7 is a flowchart showing a compensation method for a display screen according to an embodiment of the present disclosure.

FIG. 7 is a flowchart showing a compensation method for a display screen according to an embodiment of the present disclosure. As shown in FIG. 7, the compensation method may comprise steps S702 to S706.

At step S702, a resistance change amount of a resistance-sensitive element provided in a deformation area of the display screen is detected. A resistance of the resistance-sensitive element changes when the resistance-sensitive element is deformed.

In some embodiments, the step S702 may comprise: generating a bridge current by a Huygens bridge circuit in a case where the resistance-sensitive element is deformed; converting the bridge current into an analog voltage amount; and converting the analog voltage amount into a digital amount. The digital amount represents the resistance change amount.

At step S704, a drift amount of a characteristic curve of a driving transistor in the deformation area is obtained according to the resistance change amount.

In some embodiments, the step S704 may comprise: obtaining a bending degree of the deformation area according to the resistance change amount; and obtaining the drift amount of the characteristic curve of the driving transistor in the deformation area according to the bending degree.

In other embodiments, the step S704 may comprise: obtaining a bending degree of the deformation area according to the resistance change amount; determining bending times of the deformation area according to times of occurrence of the resistance change amount; and obtaining the drift amount of the characteristic curve of the driving transistor in the deformation area according to the bending degree and the bending times.

At step S706, a driving voltage signal output to the driving transistor is adjusted according to the drift amount.

In some embodiments, the step S706 may comprise: adjusting a voltage value or a duty cycle of the driving voltage signal output to the driving transistor according to the drift amount. The gate-source voltage of the driving transistor may be adjusted by adjusting the voltage value of the driving voltage signal, thereby adjusting the light emission brightness of the deformation area. The duty cycle of the driving voltage signal is adjusted so that the light emission time of the pixels in the deformation area is adjusted. In such two manners, the brightness compensation of the deformation area may be achieved, so that the light emission brightness of the deformation area is more uniform.

In some embodiments, the step of adjusting the voltage value or the duty cycle of the driving voltage signal according to the drift amount may comprise: determining whether the drift amount of the characteristic curve is greater than a threshold value; and adjusting the voltage value or the duty cycle of the driving voltage signal according to the drift amount in a case where the drift amount is greater than the threshold value.

In some embodiments, the step of adjusting the voltage value or the duty cycle of the driving voltage signal according to the drift amount may comprise: obtaining a change in a driving current flowing from the driving transistor according to the drift amount; increasing the voltage value or the duty cycle of the driving voltage signal in a case where the driving current decreases; and reducing the voltage value or the duty cycle of the driving voltage signal in a case where the driving current increases.

So far, a compensation method for a display screen according to some embodiments of the present disclosure is provided. In the compensation method, the resistance change amount of the resistance-sensitive element provided in the deformation area of the display screen is detected. The drift amount of the characteristic curve of the driving transistor in the deformation area is obtained according to the resistance change amount. The driving voltage signal output to the driving transistor is adjusted according to the drift amount. By adjusting the driving voltage signal, the brightness compensation of the deformation area may be achieved, so that the light emission brightness of the deformation area is more uniform.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments or equivalently substitution of part of the technical features may be made without departing from the scope and spirit of the present disclosure. The scope of the present disclosure is defined by the appended claims.

What is claimed is:

1. A compensation device for a display screen, comprising:
    a detection circuit comprising a resistance-sensitive element provided in a deformation area of the display screen and configured to detect a resistance change amount of the resistance-sensitive element, wherein a resistance of the resistance-sensitive element changes when the resistance-sensitive element is deformed; and
    a processor configured to obtain a drift amount of a characteristic curve of a driving transistor in the deformation area according to the resistance change amount, and adjust a driving voltage signal output to the driving transistor according to the drift amount;
    wherein the detection circuit comprises:
    a Huygens bridge circuit comprising the resistance-sensitive element and configured to generate a bridge current in a case where the resistance-sensitive element is deformed;
    a current-voltage conversion circuit configured to convert the bridge current into an analog voltage amount; and
    an analog-to-digital conversion circuit configured to convert the analog voltage amount into a digital amount and transmit the digital amount to the processor, wherein the digital amount represents the resistance change amount;

wherein the Huygens bridge circuit further comprises:
a first resistor, a first terminal of the first resistor being electrically connected to one terminal of a power supply, one terminal of the resistance-sensitive element being electrically connected to another terminal of the power supply, and a second terminal of the first resistor being directly connected to another terminal of the resistance-sensitive element and an input terminal of the current-voltage conversion circuit;
a second resistor, a first terminal of the second resistor being electrically connected to the one terminal of the power supply, and a second terminal of the second resistor being electrically connected to the another terminal of the resistance-sensitive element; and
a third resistor, a first terminal of the third resistor being electrically connected to the another terminal of the power supply, and a second terminal of the third resistor being electrically connected to the another terminal of the resistance-sensitive element.

2. The compensation device according to claim 1, wherein the processor is configured to obtain a bending degree of the deformation area according to the resistance change amount, and obtain the drift amount of the characteristic curve of the driving transistor in the deformation area according to the bending degree.

3. The compensation device according to claim 1, wherein the processor is configured to adjust a voltage value or a duty cycle of the driving voltage signal output to the driving transistor according to the drift amount.

4. The compensation device according to claim 3, wherein the processor is configured to determine whether the drift amount of the characteristic curve is greater than a threshold value, and adjust the voltage value or the duty cycle of the driving voltage signal according to the drift amount in a case where the drift amount is greater than the threshold value.

5. The compensation device according to claim 3, wherein the processor is configured to obtain a change in a driving current flowing from the driving transistor according to the drift amount, increase the voltage value or the duty cycle of the driving voltage signal in a case where the driving current decreases, and reduce the voltage value or the duty cycle of the driving voltage signal in a case where the driving current increases.

6. The compensation device according to claim 2, wherein the processor is further configured to determine bending times of the deformation area according to times of occurrence of the resistance change amount, and obtain the drift amount of the characteristic curve according to the bending degree and the bending times.

7. The compensation device according to claim 1, wherein the resistance-sensitive element comprises a piezoelectric thin film structural layer or a piezoresistive material layer.

8. The compensation device according to claim 1, wherein the resistance-sensitive element comprises:
a first electrode layer and a second electrode layer,
a first optically clear adhesive layer and a second optically clear adhesive layer, wherein the first optically clear adhesive layer and the second optically clear adhesive layer are between the first electrode layer and the second electrode layer; and
a piezoelectric thin film layer between the first optically clear adhesive layer and the second optically clear adhesive layers.

9. A display screen, comprising: the compensation device according to claim 1.

10. The display screen according to claim 9, wherein the display screen is a folding display screen, and the deformation area comprises a folding area.

11. A display device, comprising: a display screen according to claim 9.

12. A compensation method for a display screen, comprising:
detecting a resistance change amount of a resistance-sensitive element provided in a deformation area of the display screen, wherein a resistance of the resistance-sensitive element changes when the resistance-sensitive element is deformed;
obtaining a drift amount of a characteristic curve of a driving transistor in the deformation area according to the resistance change amount; and
adjusting a driving voltage signal output to the driving transistor according to the drift amount;
wherein the detecting of the resistance change amount of the resistance-sensitive element comprises:
generating a bridge current by a Huygens bridge circuit in a case where the resistance-sensitive element is deformed;
converting the bridge current into an analog voltage amount by a current-voltage conversion circuit; and
converting the analog voltage amount into a digital amount by an analog-to-digital conversion circuit, wherein the digital amount represents the resistance change amount;
wherein the Huygens bridge circuit further comprises:
a first resistor, a first terminal of the first resistor being electrically connected to one terminal of a power supply, one terminal of the resistance-sensitive element being electrically connected to another terminal of the power supply, and a second terminal of the first resistor being directly connected to another terminal of the resistance-sensitive element and an input terminal of the current-voltage conversion circuit;
a second resistor, a first terminal of the second resistor being electrically connected to the one terminal of the power supply, and a second terminal of the second resistor being electrically connected to the another terminal of the resistance-sensitive element; and
a third resistor, a first terminal of the third resistor being electrically connected to the another terminal of the power supply, and a second terminal of the third resistor being electrically connected to the another terminal of the resistance-sensitive element.

13. The compensation method according to claim 12, wherein the obtaining of the drift amount of the characteristic curve of the driving transistor in the deformation area according to the resistance change amount comprises:
obtaining a bending degree of the deformation area according to the resistance change amount; and
obtaining the drift amount of the characteristic curve of the driving transistor in the deformation area according to the bending degree.

14. The compensation method according to claim 12, wherein the adjusting of the driving voltage signal output to the driving transistor according to the drift amount comprises:
adjusting a voltage value or a duty cycle of the driving voltage signal output to the driving transistor according to the drift amount.

15. The compensation method according to claim 14, wherein the adjusting of the voltage value or the duty cycle of the driving voltage signal according to the drift amount comprises:

determining whether the drift amount of the characteristic curve is greater than a threshold value; and adjusting the voltage value or the duty cycle of the driving voltage signal according to the drift amount in a case where the drift amount is greater than the threshold value.

16. The compensation method according to claim 14, wherein the adjusting of the voltage value or the duty cycle of the driving voltage signal according to the drift amount comprises:

obtaining a change in a driving current flowing from the driving transistor according to the drift amount;

increasing the voltage value or the duty cycle of the driving voltage signal in a case where the driving current decreases; and reducing the voltage value or the duty cycle of the driving voltage signal in a case where the driving current increases.

17. The compensation method according to claim 12, wherein the obtaining of the drift amount of the characteristic curve of the driving transistor in the deformation area according to the resistance change amount comprises:

obtaining a bending degree of the deformation area according to the resistance change amount;

determining bending times of the deformation area according to times of occurrence of the resistance change amount; and obtaining the drift amount of the characteristic curve of the driving transistor in the deformation area according to the bending degree and the bending times.

* * * * *